United States Patent
Matsumoto et al.

(10) Patent No.: US 7,401,276 B2
(45) Date of Patent: Jul. 15, 2008

(54) SEMICONDUCTOR DEVICE WITH TEST CIRCUIT AND TEST METHOD OF THE SAME

(75) Inventors: Katsuhide Matsumoto, Kanagawa (JP); Masaaki Souda, Kanagawa (JP); Masafumi Mitsuishi, Kanagawa (JP); Shingo Sakai, Kanagawa (JP); Hiromu Katou, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 210 days.

(21) Appl. No.: 11/315,595

(22) Filed: Dec. 23, 2005

(65) Prior Publication Data

US 2006/0253758 A1    Nov. 9, 2006

(30) Foreign Application Priority Data

Dec. 24, 2004    (JP)    ............................. 2004-374063

(51) Int. Cl.
*G01R 31/28* (2006.01)
*G01F 11/00* (2006.01)

(52) U.S. Cl. .................. 714/724; 714/735; 714/738

(58) Field of Classification Search ................. 714/724, 714/735, 736, 738, 799, 819; 702/72; 341/111
See application file for complete search history.

(56) References Cited

U.S. PATENT DOCUMENTS

| 6,977,538 B2* | 12/2005 | Moll ........................... 327/276 |
| 7,251,765 B2* | 7/2007 | Kushiyama et al. ......... 714/733 |
| 2002/0174159 A1 | 11/2002 | Laquai |

FOREIGN PATENT DOCUMENTS

JP    2002-368827 A    12/2002

\* cited by examiner

*Primary Examiner*—Phung M Chung
(74) *Attorney, Agent, or Firm*—Foley & Lardner LLP

(57) ABSTRACT

A semiconductor device includes an output path; an input path; and a test signal generating circuit. The test signal generating circuit generates an input test data signal by changing at least one of an amplitude and a phase of an output test data signal which is generated from a test data in the semiconductor device and transferred on the output path, and supplies the input test data signal onto the input path. The output path and the input path are tested by using the output test data signal and the input test data signal, respectively.

14 Claims, 13 Drawing Sheets

Fig. 5

| | IN1 IN2 / IN3 IN4 (1/0) | $D_{out}+$ | $D_{out}-$ | $(D_{out}+)-(D_{out}-)$ |
|---|---|---|---|---|
| (0,0) | 0 0 0 1 | $V_{DD}-R(I_{main}+I_{post})$ | $V_{DD}$ | $-R(I_{main}+I_{post})$ |
| (0,1) | 0 1 1 0 | $V_{DD}-RI_{main}$ | $V_{DD}-RI_{post}$ | $-R(I_{main}-I_{post})$ |
| (1,0) | 1 0 0 1 | $V_{DD}-RI_{post}$ | $V_{DD}-RI_{main}$ | $R(I_{main}-I_{post})$ |
| (1,1) | 1 1 1 0 | $V_{DD}$ | $V_{DD}-R(I_{main}+I_{post})$ | $R(I_{main}+I_{post})$ |

Fig. 7

| | $T_n \rightarrow T_{n+1}$ | $T_n \rightarrow T_{n+1}$ | $T_n \rightarrow T_{n+1}$ |
|---|---|---|---|
| | (IN1, IN3) | (IN1, IN3) | $D_{out}+$ |
| 70a | (0, 0) | (0, 0) | $-V2 \rightarrow -V2$ |
| 70b | (0, 1) | (0, 0) | $-V1 \rightarrow -V2$ |
| 70c | (1, 1) | (0, 1) | $V2 \rightarrow -V1$ |
| 70d | (1, 0) | (0, 1) | $V1 \rightarrow -V1$ |
| 70e | (1, 0) | (1, 1) | $V1 \rightarrow V2$ |
| 70f | (1, 1) | (1, 1) | $V2 \rightarrow V2$ |
| 70g | (0, 1) | (1, 0) | $-V1 \rightarrow V1$ |
| 70h | (0, 0) | (1, 0) | $-V2 \rightarrow V1$ |

Fig. 11

| $D_{main}+$ $D_{main}-$ $D_{post}+$ $D_{post}-$ | | | | $D_{out}+$ | $D_{out}-$ | $(D_{out}+) - (D_{out}-)$ |
|---|---|---|---|---|---|---|
| (0, 0) | 0 | 0 | 1 | 1 | $V_{DD}$ | $V_{SS}$ | $(V_{DD}-V_{SS})$ |
| (0, 1) | 0 | 1 | 1 | 0 | $\dfrac{Rmain}{(Rpost+Rmain)}(V_{DD}-V_{SS})$ | $\dfrac{Rpost}{Rmain+Rpost}(V_{DD}-V_{SS})$ | $\dfrac{Rmain-Rpost}{Rmain+Rpost}(V_{DD}-V_{SS})$ |
| (1, 0) | 1 | 0 | 0 | 1 | $\dfrac{Rpost}{Rmain+Rpost}(V_{DD}-V_{SS})$ | $\dfrac{Rmain}{Rmain+Rpost}(V_{DD}-V_{SS})$ | $\dfrac{-Rmain+Rpost}{Rmain+Rpost}(V_{DD}-V_{SS})$ |
| (1, 1) | 1 | 0 | 1 | 0 | $V_{SS}$ | $V_{DD}$ | $-(V_{DD}-V_{SS})$ |

Fig. 13

|  | 91 | 92 | 93 | 94 |
|---|---|---|---|---|
| FIFTH INVERTER | Off | On | Off | On |
| SIXTH INVERTER | Off | Off | On | On |
| V1/V2 | (0.00) | 0.78 | 0.60 | 0.45 |

SEMICONDUCTOR DEVICE WITH TEST CIRCUIT AND TEST METHOD OF THE SAME

BACKGROUND OF THE INVENTION

1. Field of the Invention

The present invention relates to a semiconductor device, and in particular, relates to a semiconductor device with a test circuit, and a test method of the semiconductor device.

2. Description of the Related Art

In recent years, a data transfer rate between semiconductor devices has been increased, and transmission at a high data rate of, for example, several Gbps (Gigabit per second) is realized. In general, serial transmission is used for high-speed transmission rather than parallel transmission, since skew adjustment between signals is difficult in the parallel transmission. Additionally, it is necessary to process reception data in parallel inside the semiconductor device. Therefore, a signal transmitting and receiving circuit is provided with a circuit that carries out serial-parallel conversion (to be referred to as "SerDes circuit", hereinafter). Such a SerDes circuit is provided with a serializer for converting a parallel data into a serial data, and a deserializer for converting the serial data into the parallel data.

The increase in the data transfer rate means that transmission and reception of a data signal can be carried out by using a clock signal with a higher frequency. At this time, degradation of the signal waveform of the data signal in the course of the transmission cannot be sometimes ignored. Therefore, it is necessary to previously test whether or not the SerDes circuit operates correctly even if the data signal with signal waveform degraded is supplied. For this purpose, the SerDes circuit is generally provided with a test signal generating circuit that outputs a test signal for testing a normal operation of the SerDes circuit. The test signal generating circuit conducts the test by receiving a test data signal transmitted from a transmitting circuit of the SerDes circuit and returning the test data signal to a receiving circuit without giving any change at all to the test data, as described in Japanese Laid Open Patent Application (JP-P2002-368827A). The SerDes circuit compares the test data signal outputted from the transmitting circuit and the returned test data signal, and determines whether a target circuit operates correctly.

FIG. 1 is a circuit diagram showing a configuration of a conventional test signal generating circuit 100. As shown in FIG. 1, the conventional test signal generating circuit 100 includes a differential amplifier circuit 101 having a first output node N201 and a second output node N202; a first capacitance 102; and a second capacitance 103. The first capacitance 102 is connected between a ground line $V_{SS}$ and the first output node N201. Similarly, the second capacitance 103 is connected between the ground line $V_{SS}$ and the second output node N202. The differential amplifier circuit 101 includes a differential transistor pair of a first transistor M201 and a second transistor M202; a constant current source M203 connected between the differential transistor pair and the ground line $V_{SS}$; a first resistance R201; and a second resistance R202. The first resistance is connected between a power supply line $V_{DD}$ and the first node N201, and the second resistance R202 is connected between the power supply line $V_{DD}$ and the second output node N202.

With reference to FIG. 1, the test signal generating circuit 100 has a low-pass filter (an integrator circuit) of the first resistance R201 and the first capacitance 102, and a low-pass filter (integrator circuit) of the second resistance R202 and the second capacitance 103. Thus, the test signal generating circuit 100 receives, as a test signal, a first differential input Dmain+ supplied to the first transistor M201 and a second differential input Dmain− supplied to the second transistor M202 and outputs a first output signal Dout− and a second output signal Dout+.

In the conventional test signal generating circuit 100 shown in FIG. 1, the waveform of the test signal is degraded due to the low-pass filters or the integrator circuits. Thus, the test is accomplished to deal with a case where the waveform of a signal supplied from the outside of a chip is degraded. In this case, a waveform degradation rate at a frequency is determined based on the resistance and the capacitance in the low-pass filter (integrator circuit). However, there is a case where an actual signal waveform is not degraded in a constant rate. Thus, a technique is demanded that can carry out the test by optionally changing the signal waveform of the test signal.

Also, the resistance and the capacitance are independently affected by process variations. Therefore, the waveform degradation rate of the low-pass filter (integrator circuit) is also affected by the process variations. Consequently, the conventional test signal generating circuit 100 may generate a degradation signal different from a desired degradation signal. Thus, a technique is demanded that forms a test signal generating circuit less subject to the effect of the process variations in manufacturing the circuit.

SUMMARY OF THE INVENTION

In an aspect of the present invention, a semiconductor device includes an output path; an input path; and a test signal generating circuit. The test signal generating circuit generates an input test data signal by changing at least one of an amplitude and a phase of an output test data signal which is generated from a test data in the semiconductor device and transferred on the output path, and supplies the input test data signal onto the input path. The output path and the input path are tested by using the output test data signal and the input test data signal, respectively.

Here, the semiconductor device may further include a comparing circuit configured to compare the test data and a reception test data obtained from the input test data signal, and to determine whether or not the output path and the input path operate correctly, based on the comparing result.

Also, the test signal generating circuit may include a first differential amplifier configured to receive the output test data signal as differential input signals and to output first differential output signals from output terminals; and a second differential amplifier connected with the output terminals to have a same polarity of as the first differential amplifier. The second differential amplifier generates second differential output signals from delayed differential input signals obtained by delaying the differential input signals by 1 bit and supplies the second differential output signals to the output terminals.

In this case, the first differential amplifier may include a first differential transistor pair configured to receive the differential input signals; and a first current source configured to supply a first current to the first differential transistor pair. Also, the second differential amplifier may include a second differential transistor pair configured to receive the delayed differential input signals; and a second current source configured to supply a second current to the second differential transistor pair. A ratio of the first current to the second current is predetermined.

Also, the test signal generating circuit may include a first buffer circuit configured to output a first output signal with a predetermined amplitude based on the output test data signal;

and a second buffer circuit configured to output a second output signal based on a delayed output test data obtained by delaying the output test data signal by one bit. The first output signal and the second output signal are combined and outputted as the input test data signal which has an amplitude different from an amplitude of the output test data signal.

In this case, the output test data signal may include a first test signal and a second test signal which is an inversion signal of the first test signal. The first buffer circuit may include a first inverter configured to invert the first test signal to produce a first inversion test signal; and a second inverter configured to invert the second test signal to produce a second inversion test signal. The second buffer circuit may include a third inverter configured to invert a first delayed test signal obtained by delaying the first test signal to produce a first inversion delayed test signal; and a fourth inverter configured to invert a second delayed test signal obtained by delaying the second test signal to produce a second inversion delayed test signal. The first inversion test signal and the first inversion delayed test signal are combined and output as a first input test signal. The second inversion test signal and the second inversion delayed test signal are combined and output as a second input test signal, and the input test data signal comprises the first input test signal and the second input test signal.

In this case, the first and second inverters may have output impedances different from those of the third and fourth inverters.

Also, the semiconductor device may further include a control circuit configured to generate a control signal. At least one of the third and fourth inverters may include a CMOS inverter circuit; and a switch configured to control an operation of the CMOS inverter in response to the control signal such that an output impedance of the at least one of the third and fourth inverters is controlled.

In another aspect of the present invention, a test method of a semiconductor device is achieved by generating an output test data signal from a test data in the semiconductor device and transferring the output test data signal on an output path; by delaying the output test data signal to produce a delayed output test data signal; and by generating an input test data signal from the output test data signal and the delayed output test data signal to change at least one of an amplitude and phase of the input test data signal and transferring onto an input path. The output path and the input path are tested by using the output test data signal and the input test data signal, respectively.

Here, the test method may be achieved by further comparing the test data and a reception test data obtained from the input test data signal, to determine whether or not the output path and the input path operate correctly, based on the comparing result.

The generating an input test data signal may be achieved by combining the output test data signal and the delayed output test data signal in a predetermined ratio of an amplitude of the output test data signal and an amplitude of the delayed output test data signal.

Also, the generating an input test data signal may be achieved by combining the output test data signal and the delayed output test data signal such that the input test data signal has a phase different from that of the output test data signal.

BRIEF DESCRIPTION OF THE DRAWINGS

FIG. 5 is a truth table showing a data transit operation in the test signal generating circuit in the first embodiment;

FIG. 7 is a table showing the transition of the first data signal Dmain+ and the first delayed signal Dpost+ respectively and the transition of the input test data signal;

FIG. 11 is a truth table showing the operation of the test signal generating circuit in the second embodiment;

FIG. 13 is a table showing the amplitude ratio V1/V2, when each of the output impedances takes various values.

DESCRIPTION OF THE PREFERRED EMBODIMENTS

Hereinafter, a semiconductor device with a test circuit of the present invention will be described with reference to the attached drawings. A test signal generating circuit of the test circuit according to the present invention is applicable to a semiconductor device, a test for which is conducted by returning a signal from an output path to an input path. For this reason, the present invention will be described by using a SerDes (Serializer-Deserializer) circuit of a single chip as an example.

First Embodiment

Figure 1:
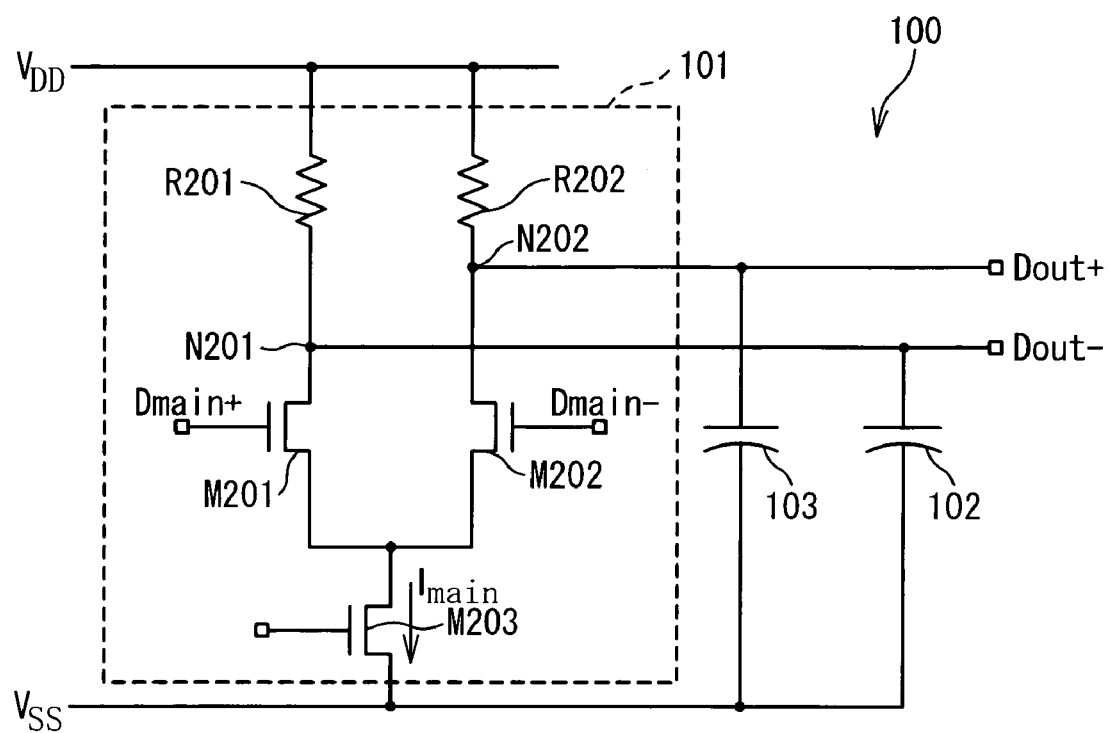
FIG. 1 is a circuit diagram showing a configuration of a conventional test signal generating circuit 100.
Figure 2:
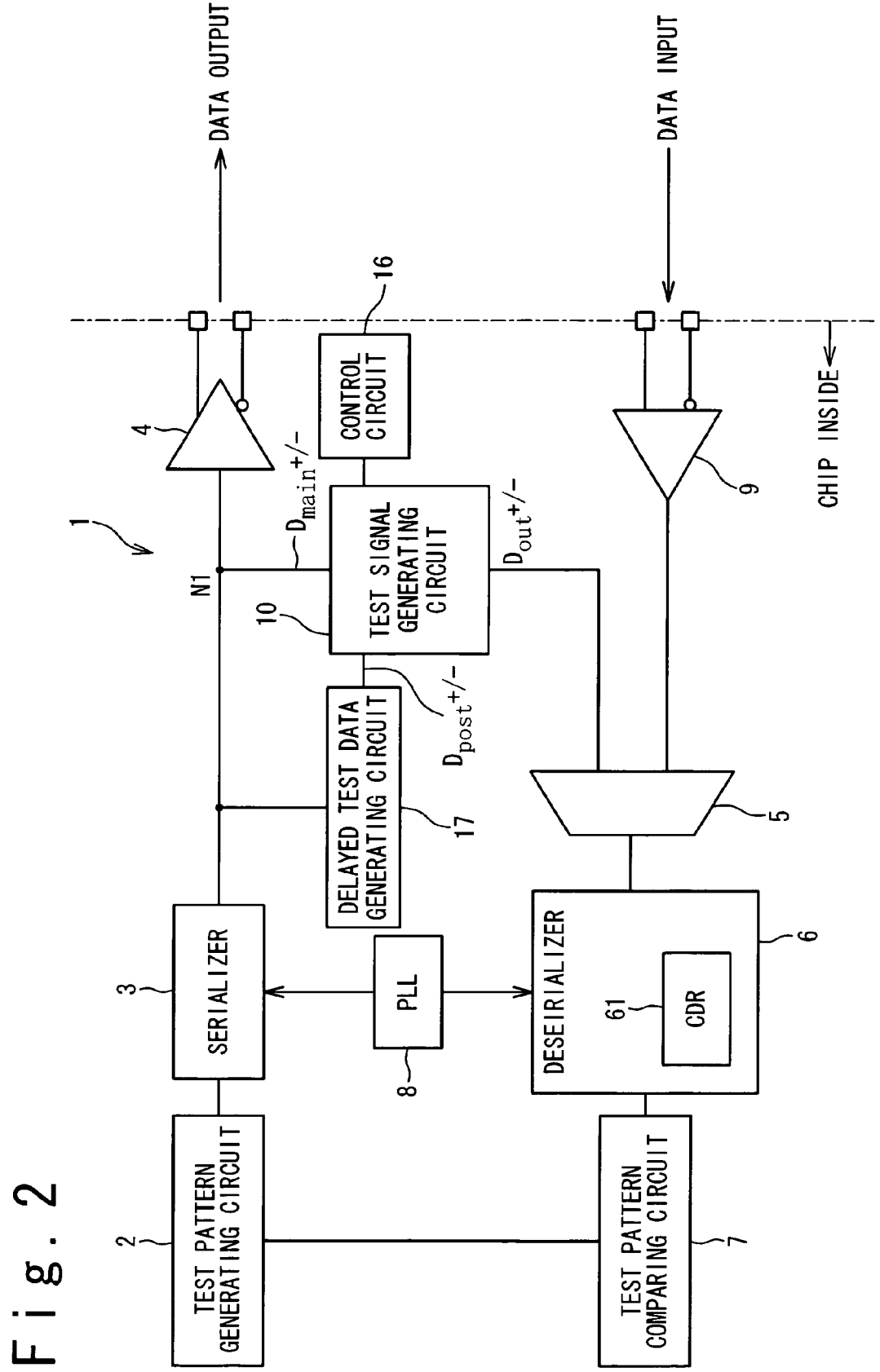
FIG. 2 is a block diagram showing a configuration of a semiconductor device with a test circuit according to a first embodiment of the present invention.

FIG. 2 is a block diagram showing a configuration of the SerDes circuit 1 as the semiconductor device with the test circuit according to the first embodiment of the present invention. With reference to FIG. 2, the SerDes circuit 1 in the first embodiment is provided with a serializer 3, a driver 4, a receiver 9, a selecting circuit 5, deserializer 6 with a CDR 61, and a PLL circuit 8. The serializer 3 converts a signal of a parallel data supplied thereto into a signal of a serial data, and the deserializer converts a signal of a serial data supplied thereto into a signal of a parallel data. The driver 4 outputs the serial data signal supplied from the serializer 3 to the outside of the SerDes circuit 1, and the receiver 9 receives a serial data signal supplied from the outside of the SerDes circuit 1. The selecting circuit 5 selects and outputs one of the serial data signal outputted from the receiver 9 and a test signal to be mentioned later to the deserializer 6. The PLL circuit 8 supplies clock signals to the serializer 3 and the deserializer 6.

The SerDes circuit 1 is further provided with a test signal generating circuit 10, a test pattern generating circuit 2, a test pattern comparing circuit 7, a delayed test data generating circuit 17, and a control circuit 16. The test pattern generating circuit 2 generates a pattern of a parallel test data in the first embodiment. The test pattern generating circuit 2 outputs the parallel test data pattern to the serializer 3 and the test pattern comparing circuit 7. It is preferable that the test pattern generating circuit 2 is configured to have a function of generating a plurality of test data patterns. In such a case, the test pattern generating circuit 2 selects one of the plurality of test data patterns, and outputs the selected parallel test data pattern. Thus, the SerDes circuit 1 can conduct various tests.

The serializer 3 generates a serial output test data signal Dmain+ and Dmain− from the parallel test data pattern supplied from the test pattern generating circuit 2 and output it to the delayed test data generating circuit 17 and the driver 4 through an output path. The driver 4 outputs the output test data signal to the outside of the semiconductor device. The delayed test data generating circuit 17 generates a delayed output test data signal Dpost+ and Dpost− obtained by delaying the output test data signal outputted from the serializer 3 for one bit. In the present invention, the delayed output test data signal Dpost+ and Dpost− may be generated by another circuit. For example, when the SerDes circuit in the first embodiment is provided with an output buffer having a pre-emphasis function, the delayed test data signal Dpost+ and Dpost− may be generated by using an inversion signal generating function for realizing the pre-emphasis function.

The control circuit 16 generates a control signal to be supplied to the test signal generating circuit 10. The test signal generating circuit 10 is connected to the output path of the SerDes circuit through a node N1. The test signal generating circuit 10 receives the output test data signal on the output path in response to the control signal supplied from the control circuit 16, and changes a waveform degradation rate of the signal waveform of the received output test data signal based on the delayed output test data signal outputted from the delayed test data generating circuit 17. Thus, the test signal generating circuit 10 generates an input test data signal to output to the selecting circuit 5. A detailed circuit configuration of the test signal generating circuit 10 will be described later. The selecting circuit 5 selects the input test data signal in a test mode. Therefore, the input test data signal is supplied to the deserializer 6 through the selecting circuit 5 in the test mode. The deserializer 6 generates a reception test data from the input test data signal. The test patter comparator circuit 7 monitors a function of the input path based on determination of whether the input test data signal is appropriately converted into the reception test data by the deserializer 6. Specifically, the test pattern comparing circuit 7 compares the test data outputted from the test pattern generating circuit 2 and the reception test data from the deserializer 6 to determine whether or not the input path correctly functions.

Figure 3:
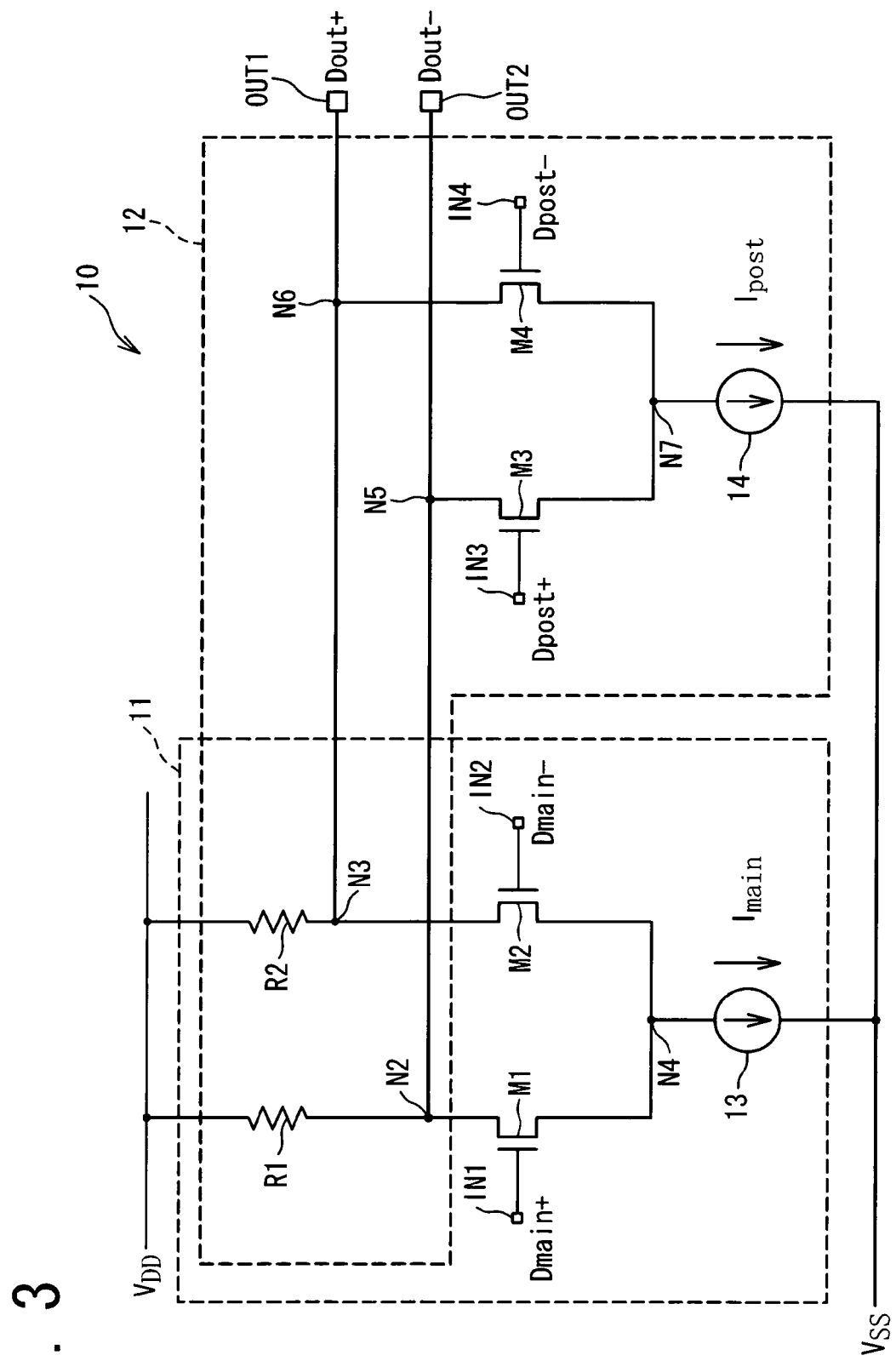
FIG. 3 is a circuit diagram showing a detailed configuration of the test signal generating circuit in the semiconductor device in the first embodiment.

FIG. 3 is a circuit diagram showing a detailed configuration of the test signal generating circuit 10 in the first embodiment. As shown in FIG. 3, the test signal generating circuit 10 in the first embodiment includes a first buffer circuit 11 and a second buffer circuit 12, which are connected to output terminals OUT1 and OUT2 with the same polarity. The first buffer circuit 11 is a differential amplifier circuit for receiving the output test data signal supplied through the node N1. The first buffer circuit 11 includes a first differential transistor pair of a first transistor M1 and a second transistor M2; a first current source 13 connected between the first differential transistor pair and a ground line $V_{SS}$; a first resistance R1 connected between a first output node N2 on the side of the first transistor M1, and a power supply line $V_{DD}$; and a second resistance R2 connected between second output node N3 on the side of the second transistor M2, and the power supply line $V_{DD}$. The second buffer circuit 12 is a differential amplifier circuit for receiving the delayed test data signal. The second buffer circuit 12 includes a second differential transistor pair of a third transistor M3 and a fourth transistor M4, and a second current source 14 connected between the second differential transistor pair and the ground line $V_{SS}$. The second buffer circuit 12 further includes the first resistance R1 connected to an output node N5 of the third transistor M3, and the second resistance R2 connected to an output node N6 of the fourth transistor M4. The output node N5 of the third transistor M3 and the first output node N2 are connected with the same polarity. Similarly, the output node N6 of the fourth transistor and the second output node N3 are connected with the same polarity.

As mentioned above, the test signal generating circuit 10 is supplied with the serial output test data signal Dmain+ and Dmain−, and the delayed output test data signal Dpost+ and Dpost− obtained by delaying the output test data signal by one bit. The output test data signal include a first test signal Dmain+ and a second test signal Dmain−. The second test signal Dmain− is an inversion signal of the first test signal Dmain+. Similarly, the delayed output test data signal include a first delayed test signal Dpost+ and a second delayed test signal Dmain−. The second delayed test signal Dmain− is an inversion signal of the first delayed test signal Dpost+. As shown in FIG. 3, in the first differential transistor pair, the first test signal Dmain+ is supplied to the first transistor M1, and the second test signal Dmain− is supplied to the second transistor M2. The first current source 13 generates and supplies a first current Imain to the first differential transistor pair. Similarly, in the second differential transistor pair, the first delayed test signal Dpost+ is supplied to the third transistor M3, and the second delayed test signal Dpost− is supplied to the fourth transistor M4. The second current source 14 generates and supplies a second current Ipost to the second differential transistor pair. The second current Ipost has a current value smaller than that of the first current Imain, to satisfy the following equation (1).

$$Imain > Ipost \tag{1}$$

Figure 4:
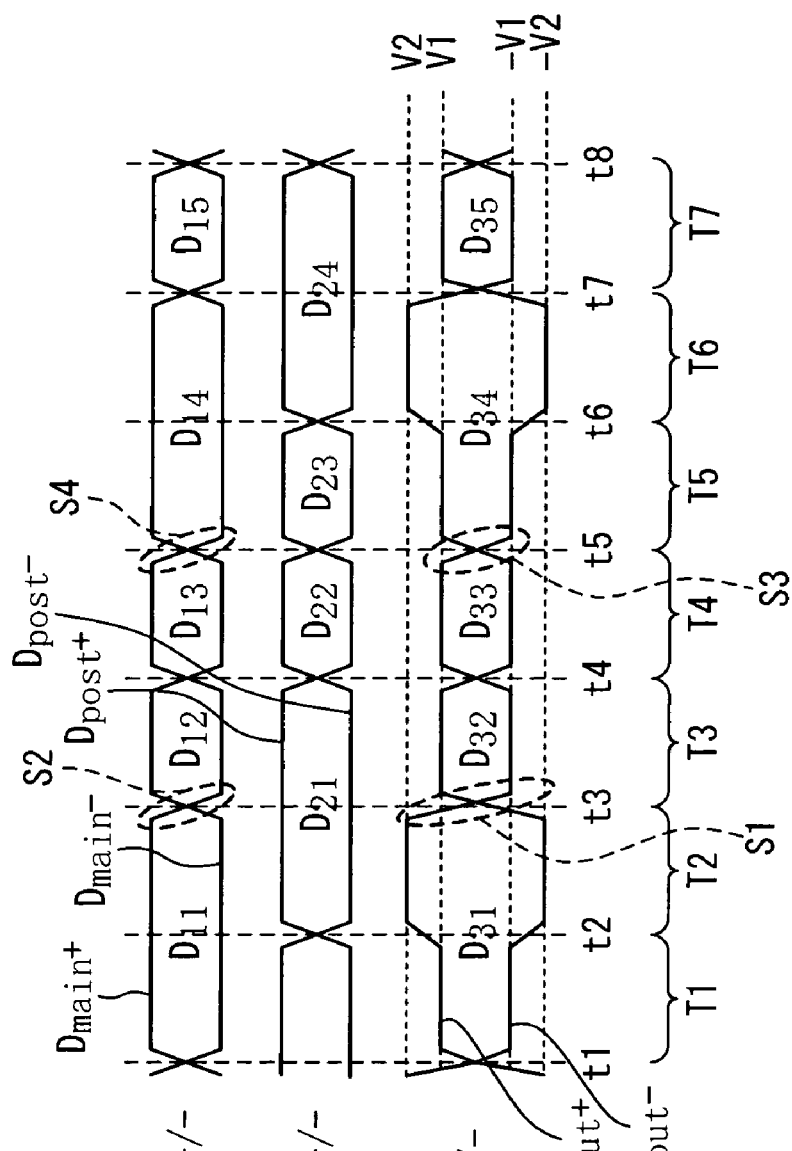
FIGS. 4A to 4C are timing charts showing operation waveforms of a output test data signal Dmain+ and Dmain−, a delayed output test data signal Dpost+ and Dpost−, and an input data signal Dout+ and Dout− as an output signal from the test data generating circuit 10, respectively.

FIGS. 4A to 4C are timing charts showing operation waveforms of the output test data signal Dmain+ and Dmain−, the delayed output test data signal Dpost+ and Dpost−, and an input data signal Dout+ and Dout− as an output signal from the test data generating circuit, respectively.

With reference to FIG. 4A, data D11 to D15 of the output test data signal Dmain+ and Dmain− are supplied in a period from times t1 to t8. Similarly, with reference to FIG. 4B, delay data D21 to D25 of the delayed output test data signal are supplied in a period from the times t2 to t9. For example, as shown in FIGS. 4A and 4B, the delayed data corresponding to the data D11 is the delay data D21, and the delayed data corresponding to the data D12 is the delay data D22.

With reference to FIG. 4C, data D31 to D35 of the input test data signal Dout+ and Dout− are outputted in a period from the times t1 to t8. As shown in FIG. 4C, the amplitudes of the input test data signal Dout+ and Dout− in the periods T1, T3, T4, T5, and T7 is smaller than those of the input test data signal Dout+ and Dout− in the periods T2 and T6. This indicates that the signal of the bit at which a data of a high-frequency component shifts is degraded, compared with that of the bit at which a data of a low-frequency component does not shift. In other words, the characteristic is similar to an output from a low-pass filter. Additionally, the waveform S1 of the input test data signal Dout is different from the waveform S2 of the output test data signal Dmain when the period shifts from T2 to T3. Also, the waveform S3 of the input test data signal Dout is similar to the waveform S4 of the output test data signal D main when the period shifts from T4 to T5. Thus, the test signal generating circuit 10 in the embodiment can generate the input test data signal Dout having the waveform similar to the waveform of the output test data signal Dmain, and the input test data signal Dout having the waveform different from the waveform of the output test data signal Dmain by adding jitter, and can return the generated input test data signal Dout to the input path.

Description is given below on data transit operation in the test signal generating circuit 10 in the embodiment. FIG. 5 is a truth table showing the data transit operation in the test signal generating circuit 10 in the first embodiment. As mentioned above, the first test signal Dmain+ and the second test signal Dmain− are supplied to input terminals IN1 and IN2 of the first differential transistor pair. The output test data signal Dmain+ and Dmain− is a differential signal, and the second test signal Dmain− is in a low level, when the first test signal Dmain+ is in a high level. Similarly, the first delayed signal Dpost+ and the second delayed signal Dpost− are supplied to input terminals IN3 and IN4 of the second differential transistor pair. In the description given below, the signal level of the signal is shown as "1" when the signal is in the high level and "0" when the signal is in the low level. Additionally, to facilitate an understanding of the present invention, an assumption is made that the power supply voltage is $V_{DD}$ [V] and the voltage of the ground line $V_{SS}$ is 0 [V]. Also, the resistances of the first resistance R1 and the second resistance R2 are R [Ω].

With reference to FIG. 5, it is supposed that the input terminal In1 of the first transistor M1 is "0" and the input terminal IN3 of the third transistor M3 is "0". At this time, the input terminal IN2 of the second transistor M2 is "1", and the input terminal IN4 of the fourth transistor M4 is "1". In this case, a voltage Vout1 of the output terminal OUT1 and a voltage Vout2 of the output terminal OUT2 are given as follows:

$$Vout1 = V_{DD} - R(Imain + Ipost)$$

$$Vout2 = V_{DD}$$

Also, it is supposed that the input terminal IN1 of the first transistor M1 is "0", and the input terminal IN3 of the third transistor M3 is "1". At this time, the input terminal IN2 of the second transistor M2 is "1", and the input terminal IN4 of the fourth transistor M4 is "0". In this case, the voltage Vout1 of the output terminal OUT1 and the voltage Vout2 of the output terminal OUT2 are given as follows:

$$Vout1 = V_{DD} - R*Imain$$

$$Vout2 = V_{DD} - R*Ipost$$

Similarly, by deriving the output voltages Vout1 and Vout2 for the signals supplied to the respective input terminals IN1 to IN4, voltage values shown in a region 53 of FIG. 5 can be obtained. A region 54 shows the output voltages (Dout+)−(Dout−) outputted from the test signal generating circuit 10 for the voltage values in the region 53. The output voltages (Dout+)−(Dout−) of the test signal generating circuit 10 are as follows:

$$(Dout+) - (Dout-) = -R(Imain + Ipost)$$

$$(Dout+) - (Dout-) = -R(Imain - Ipost)$$

$$(Dout+) - (Dout-) = R(Imain + Ipost)$$

$$(Dout+) - (Dout-) = R(Imain - Ipost)$$

As is clear from the above, the output voltages (Dout+)−(Dout−) can be determined based on a ratio of the first current Imain to the second current Ipost.

Here, under the assumption:

$$V2 = R(Imain + Ipost)$$

$$V1 = R(Imain - Ipost)$$

$$-V1 = -R(Imain - Ipost)$$

$$-V2 = -R(Imain + Ipost)$$

the input test data signal (Dout+/Dout−) outputted from the test signal generating circuit 10 will be described.

Figure 6:
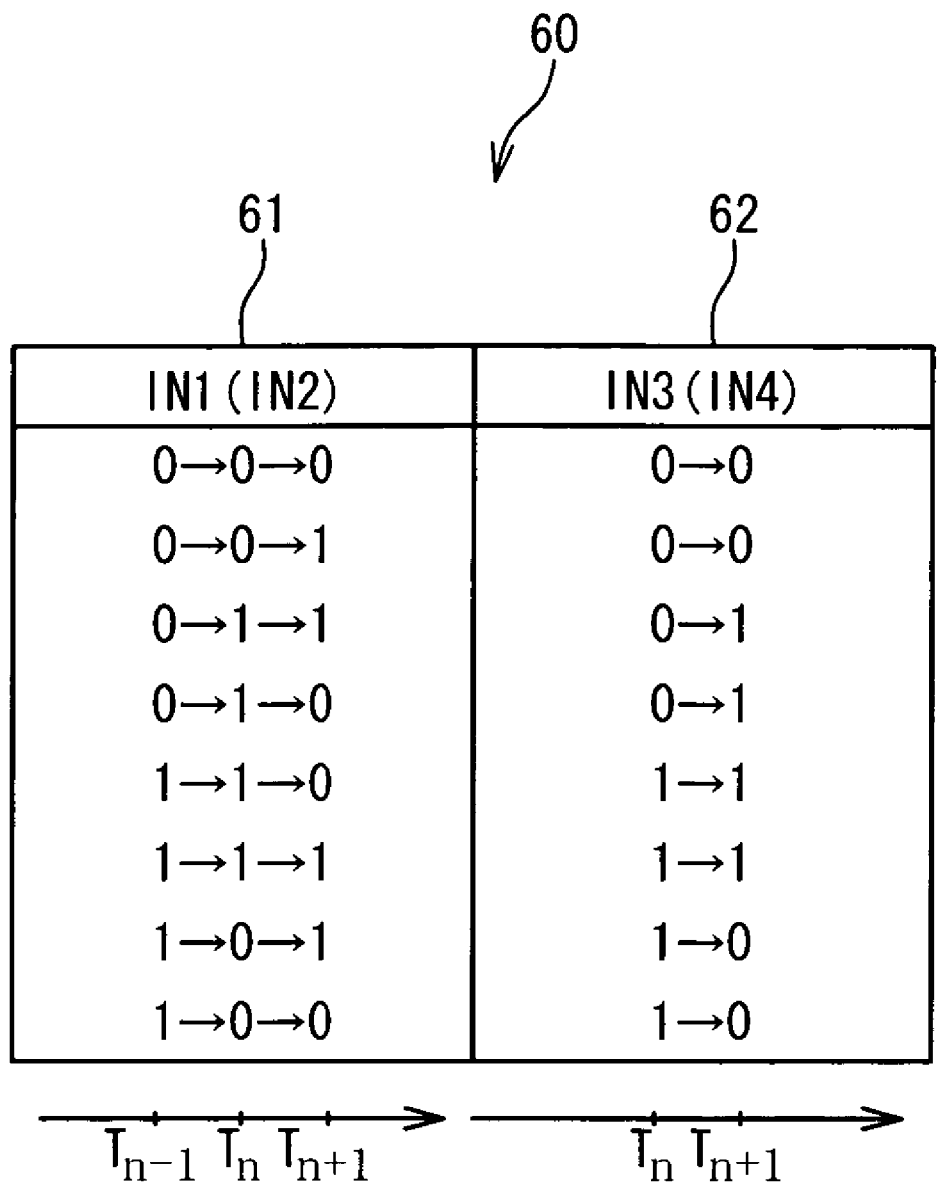
FIG. 6 shows a table showing a correspondence relation of transition of a first test signal Dmain+, and transition of a first delayed signal Dpost+.

FIG. 6 shows a table showing a correspondence relation of transition of the first test signal Dmain+, and transition of the first delayed signal Dpost+. A region 61 shows the transition of the first test signal Dmain+ when the period shifts from Tn−1 through Tn to Tn+1. A region 62 shows the transition of the first delayed signal Dpost+ when the period shifts from Tn to Tn+1. As stated above, the first delayed signal Dpost+ is a signal obtained by delaying the first test signal Dmain+ by one bit. Therefore, as shown in FIG. 6, the first test signal Dmain+ in the periods from Tn−1 to Tn is supplied to the input terminal IN3 of the third transistor M3 as the first delayed signal Dpost+ in the periods from Tn to Tn+1.

FIG. 7 is a table showing the transition of the first data signal Dmain+ and the first delayed signal Dpost+ respectively supplied to the first transistor M1 and the third transistor M3, and the transition of the input test data signal. With reference to FIG. 7, a region 71 shows a combination of the first test signal Dmain+ and the first delayed signal Dpost+ in the period Tn. A region 72 shows the combination of the first test signal Dmain+ and the first delayed signal Dpost+ in the period Tn+1. A region 73 in FIG. 7 shows the change in the output voltage the period from Tn to Tn+1. For example, the input test data signal shifts from V2 to −V1 when the combination of Dmain+ and Dpost+ in the period from Tn and Tn+1 are (1,1) and (0,1) respectively, as shown by 70c in FIG. 7.

As shown in FIG. 7, there are two cases where the input test data signal shifts to +V1 in the period Tn+1, that is, the input test data signal shifts from −V1 to +V1 in one case, and from −V2 to +V1 in the other case. Similarly, there are two cases where the input test data signal shifts to −V1 in the period Tn+1, that is, the input test data signal shifts from +V1 to −V1 in one case, and from +V2 to −V1 in the other case. Detailed description is given below on the shift in the input test data signal by using a graph.

Figure 8:
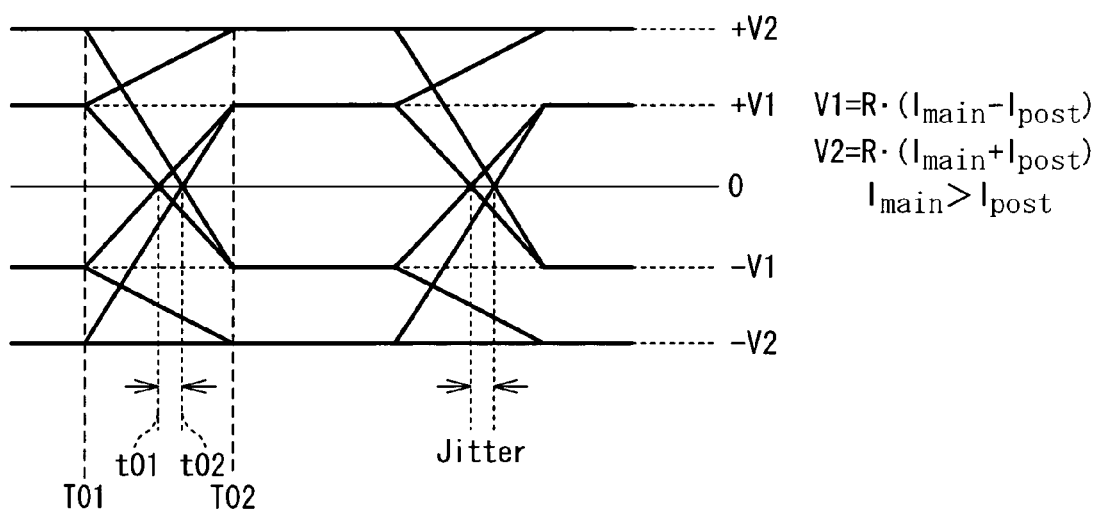
FIG. 8 is a diagram showing the shift in the voltage of an input test data signal.

FIG. 8 is a diagram showing the shift in the voltage of the input test data signal, being generally referred to as an EYE pattern (or an EYE opening). As described in FIG. 7, there are two cases for a pattern in which (Dout+)−(Dout−) in the test signal generating circuit 10 in the embodiment shifts to +V1 in the period Tn+1: the data signal shifts from −V1 to +V1 in one case, and from −V2 to +V2 in the other case. In FIG. 8, four kinds of lines are shown that intersect with the line of V=0, namely, −V1 to +V1: Line 1
+V1 to −V1: Line 2
−V2 to +V1: Line 3
+V2 to −V1: Line 4

The degradation of the signal waveform in the embodiment (to be referred to as "jitter", hereinafter) can be defined as a difference between a minimum value and a maximum value on time at the intersection points of the lines 1 to 4 and the line of V=0. Description will be given below with an example of a case where Rise Time and Fall Time are equal, for the purpose of facilitating the understanding of the present invention.

When the Rise Time is equal to the Fall time, the time at the intersection point of the line 1 and the line of V=0 is a time t01, which is the same as the time at the intersection point of the line 2 and the line of V=0. Similarly, the time at the intersection point of the line 3 and the line of V=0 is a time t02, which is the same as the time at the intersection point of the line 4 and the line of V=0. Therefore, the jitter to be derived can be given by the time t01 at the intersection point of the line 1 (−V1 to +V1) and the line of V=0 and the time t02 at the intersection point of the line 3 (−V2 to +V1) and the line of V=0, as shown by the following equation (2).

$$t02 - t01 = \text{jitter} \quad (2)$$

Figure 9:
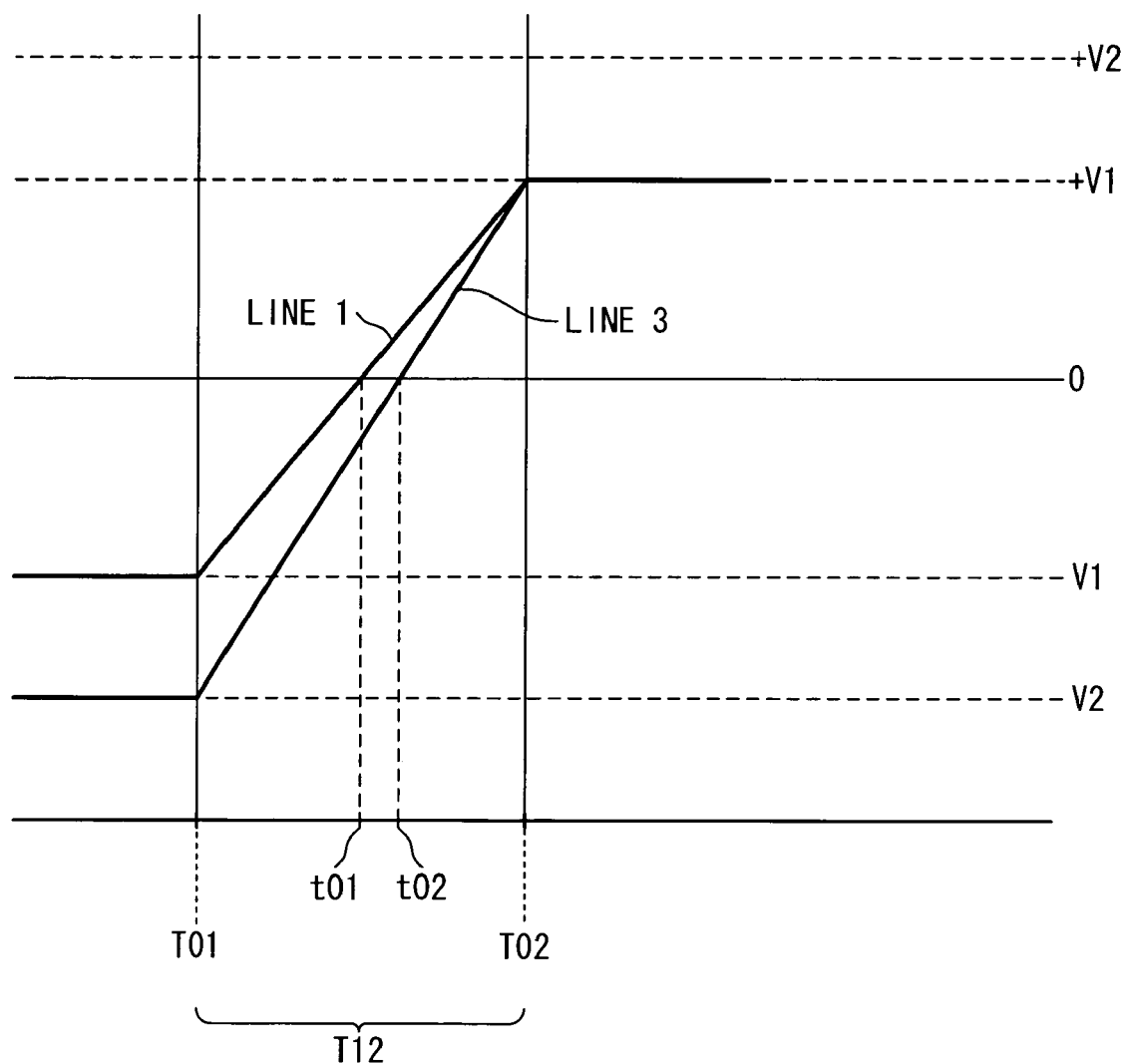
FIG. 9 is a diagram showing the lines 1 and 3 extracted from the EYE pattern of FIG. 8.

FIG. 9 is a diagram showing the lines 1 and 3 extracted from the EYE pattern of FIG. 8. With reference to FIG. 9, when the signal level of the input test data signal shifts from −V1 to +V1, the shift starts at a time T01 and ends at a time T02. Also, when the signal level of the input test data signal shifts from −V2 to +V1, the shift starts at the time T01 and ends at the time T02. Therefore, a time T12 (=T02−T01) is equivalent to the Rise time. During the time T12, it is supposed that a voltage V(t) at any time tn on the line 1 is expressed as $$V01(t) = (2*V1)*t/T12 - V1$$

In this case, the value of t01 can be specified by obtaining the value of t when V01(t)=0. Therefore, if $$(2*V1)*t/T12 - V1 = 0$$

is satisfied, the following equation is obtained:

$$t = T12/2 \quad (3)$$

Consequently, the following equation is obtained:

$$t01 = T12/2$$

In the same way, the time t02 can be obtained from the following equation (4):

$$t02 = T12*V2/(V1+V2) \quad (4)$$

From the above equation (2), the jitter is determined based on t01 and t02, namely, a phase difference. The following equation (5) is obtained by substituting the values of the equations (3) and (4) for the equation (2):

$$\begin{aligned}
\text{jitter} &= t02 - t01 \\
&= T12*V2/(V1+V2) - T12/2 \\
&= (1 - V1/V2)/(2*(1+V1/V2))*T12
\end{aligned} \quad (5)$$

As is clear from the equation (5), the jitter can be specified by an amplitude ratio V1/V2, and the Rise Time (or the Fall Time).

As stated above, V1 and V2 can be changed by changing the ratio of the first current Imain to the second current Ipost. Therefore, the test signal generating circuit 10 in the embodiment can output the input test data signal Dout+/Dout−, in which the high-frequency component is removed and jitter is added, by making current values of the first current Imain and the second current Ipost variable. Additionally, when the first current Imain and the second current Ipost are generated based on reference resistances having relatively high accuracy to the resistances R1 and R2, the product of the first current Imain and the resistance R1 and the product of the second current Ipost and the resistance R2 are not almost affected by the process variations. As a result, it is possible to remove the high-frequency component not to be almost affected by the process variations.

Second Embodiment

Figure 10:
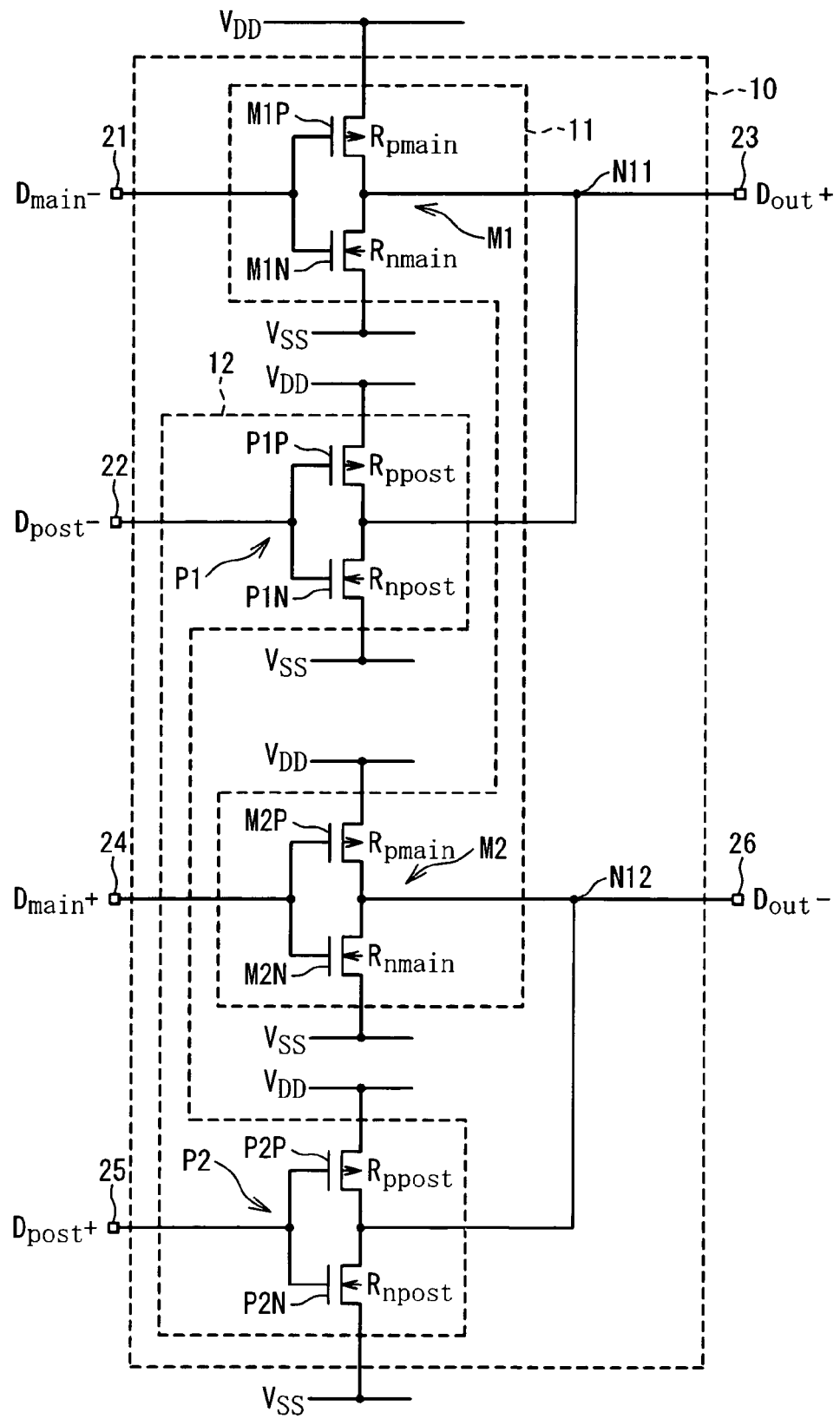
FIG. 10 is a circuit diagram showing the configuration of the test signal generating circuit according to a second embodiment of the present invention.

Next, the semiconductor device with the test circuit according to the second embodiment of the present invention will be described. FIG. 10 is a circuit diagram showing the configuration of the test signal generating circuit 10 in the second embodiment. As shown in FIG. 10, the test signal generating circuit 10 in the second embodiment includes a first buffer circuit 11 and a second buffer circuit 12. The first buffer circuit 11 in the second embodiment is a CMOS buffer circuit for receiving the output test data signal supplied through the node N1. As shown in FIG. 10, the first buffer circuit 11 in the second embodiment includes a first inverter M1 that receives a second test signal Dmain− through an input terminal 21, and a second inverter M2 that receives a first test signal Dmain+ through an input terminal 24. The output of the first inverter M1 is outputted from an output terminal 23 through a node N11. Similarly, the output of the second inverter M2 is outputted from an output terminal 26 through a node N12.

As shown in FIG. 10, the first inverter M1 is composed of a first P-channel transistor M1P and a first N-channel transistor M1N. The first P-channel transistor M1P has an output impedance Rpmain. Similarly, the first N-channel transistor M1N has an output impedance Rnmain. Also, the second inverter M2 is a CMOS inverter. The respective transistors M2P and M2N of the CMOS inverter have the output impedances Rpmain and Rnmain. The second buffer circuit 12 in the second embodiment includes a third inverter P1 that receives a second delayed signal Dpost− through an input terminal 22, and a fourth inverter P2 that receives a first delayed signal Dpost+ through an input terminal 25. The output of the third inverter P1 is connected to the output terminal 23 through the node N11. Similarly, the output of the fourth inverter P2 is connected to the output terminal 26 through the node N12. The third inverter P1 and the fourth inverter P2 are the CMOS inverters having an identical configuration to each other. With reference to FIG. 10, a P-channel transistor P1P of the third inverter P1 has an output impedance Rppost. Similarly, an N-channel transistor P1N of the third inverter P1 has an output impedance Rnpost. Also, each of the transistors forming a fourth inverter P2N has the output impedances Rppost and Rnpost.

It is preferable that the output impedance of each of the transistors in the second embodiment is designed such that a center value satisfies Rp=Rn. Thus, it becomes possible to meet the following equations:

$$Rp\text{main} = Rn\text{main} = R\text{main}$$

$$Rp\text{post} = Rn\text{post} = R\text{post}$$

It is possible to more appropriately perform control of the output voltages V1 and V2, when each of the transistors meets the conditions given by the above equations.

Additionally, the output impedance of a MOS transistor is affected by changes in a temperature and a power supply voltage, and so on. As mentioned later, the output voltage V1 and V2 in the test signal generating circuit 10 of the second embodiment can be specified by the output impedances of the first buffer circuit 11 and the second buffer circuit 12. Therefore, it is preferable that the test signal generating circuit 10 in the second embodiment is configured to further have an output impedance adjustment function.

FIG. 11 is a truth table showing the operation of the test signal generating circuit 10 in the second embodiment. In the second embodiment, the output test data signal Dmain+ and Dmain− supplied to the first buffer circuit 11 is the same as that of the first embodiment. Also, the delayed output test data signal Dpost+ and Dpost− supplied to the second buffer circuit 12 is the same as that of the first embodiment. With reference to FIG. 11, it would be apparent that the following equation (6) is given:

$$V2 = |(Dout+) - (Dout-)| \qquad (6)$$
$$= V_{DD} - V_{SS}$$

when the level of the first test signal Dmain+ supplied to the input terminal 21 and that of the first delay signal Dpost+ supplied to the input terminal 22 are in phase, namely, when the following equations are satisfied:

Dmain+=Dpost+

Dmain−=Dpost−.

Here, the output voltage V1 is calculated when the first test signal Dmain+ supplied to the input terminal 21 and the first delay signal Dpost+ supplied to the input terminal 22 are in reverse phase, namely, when the following equations are satisfied:

Dmain+=−Dpost+

Dmain−=−Dpost−("−" shows inversion).

By referring to FIG. 11, the output voltage V1 is calculated when the following conditions are satisfied:

Dmain+=0

Dmain−=1

Dpost+=1

Dpost−=0.

The first output voltage Dout+ on the output terminal 23 under the above conditions is given by the following equation:

Dout+={Rnmain/(Rppost+Rnmain)}*(VDD−VSS).

In the same way, the second output voltage Dout− on the output terminal 26 is given by the following equation:

Dout−={Rnpost/(Rpmain+Rnpost)}*($V_{DD}$−$V_{SS}$)

Here, when the output impedances of the respective transistors satisfy:

Rpmain=Rnmain=Rmain

Rppost=Rnpost=Rpost, the following equations can be obtained:

Dout+={Rmain/(Rpost+Rmain)}*($V_{DD}$−$V_{SS}$)

Dout−={Rpost/(Rmain+Rpost)}*($V_{DD}$−$V_{SS}$)

Therefore, as the first output voltage V1 at this time, the following equation (7) is given:

$$V1=|(Dout+)-(Dout-)|=\{(Rpost-Rmain)/(Rmain+Rpost)\}*(V_{DD}-V_{SS}) \qquad (7)$$

From the equations (6) and (7), the amplitude ratio V1/V2 is given by the following equation (8):

$$V1/V2=(Rpost-Rmain)/(Rmain+Rpost) \qquad (8)$$

As is clear from the equation (8), the test signal generating circuit 10 in the second embodiment can control the amplitude ratio V1/V2 by changing the output impedance of the first buffer circuit 11 and the second buffer circuit 12.

Figure 12:
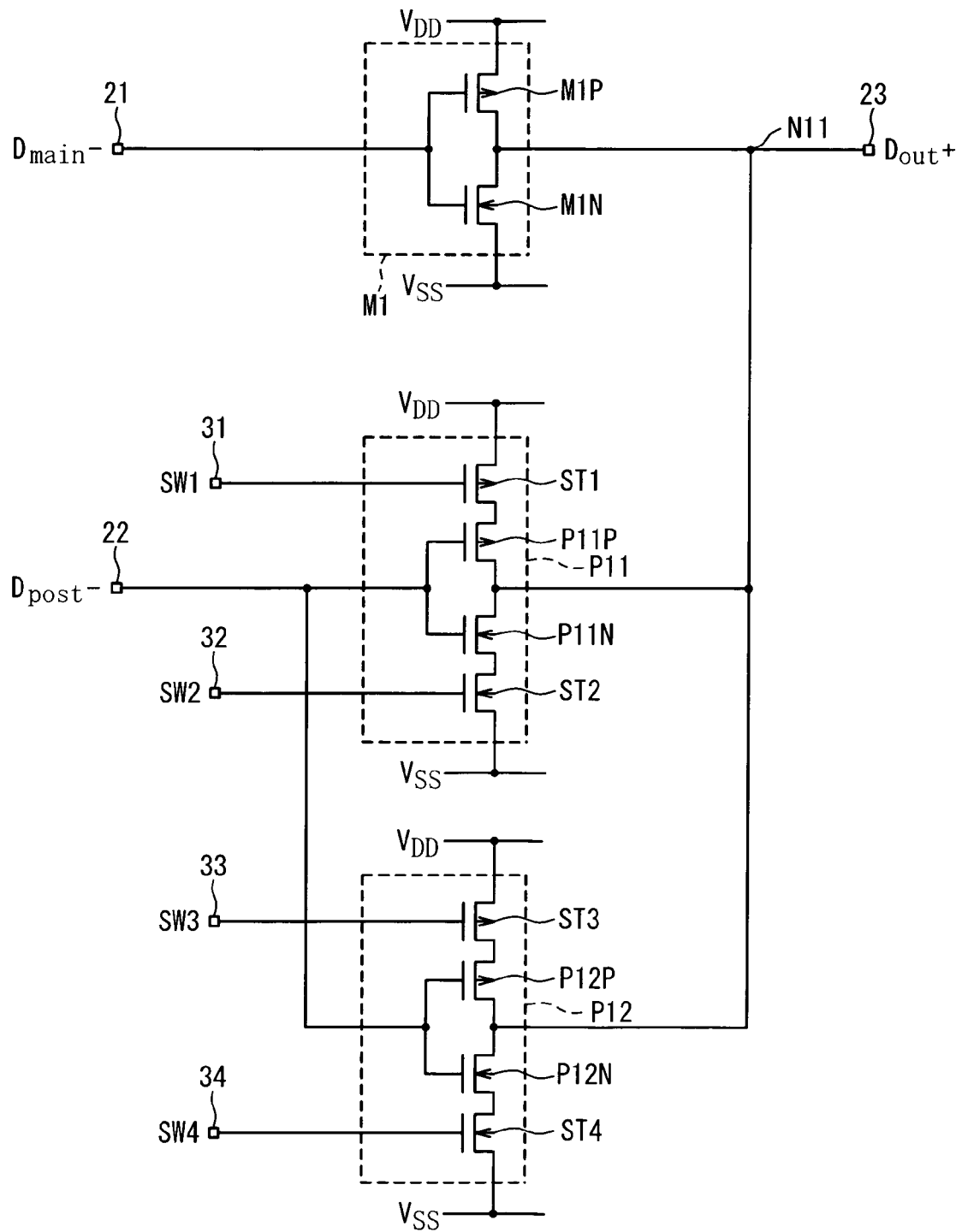
FIG. 12 is a circuit diagram showing a configuration of a modification of the test signal generating circuit 10 in the second embodiment, which has a function of variably controlling the output impedances.

FIG. 12 is a circuit diagram showing a configuration of a modification of the test signal generating circuit 10 in the second embodiment, which has a function of variably controlling the output impedances. As shown in FIG. 12, the circuit has an output stage (to be referred to as a "first output stage", hereinafter) that receives the second test signal Dmain− and the second delayed signal Dpost− in the test signal generating circuit 10. The first output stage includes the first inverter M1, a fifth inverter P11, and a sixth inverter P12. The fifth inverter P11 is a CMOS inverter by a P-channel transistor P11P and an N-channel transistor P11N. The fifth inverter P11 further includes a first switch transistor ST1 connected between the P-channel transistor P11P and the power line $V_{DD}$, and a second switch transistor ST2 connected between the N-channel transistor P11N and the ground line $V_{SS}$.

The gate of the first switch transistor ST1 is connected to an input terminal 31. Similarly, the gate of the second switch transistor ST2 is connected to an input terminal 32. Each of the input terminals 31 and 32 are connected to the control circuit 16 mentioned above (not shown). The fifth inverter P11 controls the on and off states of the switch transistors ST1 and ST2 in response to control signals SW1 and SW2 supplied from the control circuit 16. It is preferable that impedances of the first switch transistor ST1 and the second switch transistor ST2 have values small enough not to affect V1 and V2. Also, as shown in FIG. 12, the sixth inverter P12 is a circuit having the same configuration as that of the fifth inverter P11, As in case of the fifth inverter P11, the sixth inverter P12 has a third switch transistor ST3 and a fourth switch transistor ST4. The gates of the switch transistors ST3 and ST4 are connected to the control circuit 16 through input terminals 33 and 34. The sixth inverter P12 controls the on and off of the switch transistors ST3 and ST4 in response to control signals SW3 and SW4 supplied to input terminals 33 and 34 from the control circuit 16.

Here, it is supposed that the output impedance of each of the transistors P11P and P11N of the fifth inverter P11 is Rpost0, and that the output impedance of each of the transistors P12P and P12N of the sixth inverter P12 is Rpost1. Also, the output impedance of the first inverter M1 is Rmain. At this time, it is possible to form the test signal generating circuit 10 which can switch the output impedance in response to the control signals SW1 to SW4 supplied from the control circuit 16, when the following relation is satisfied:

Rpost0≠Rpost1≠Rmain.

Description is given below on the operation of the test signal generating circuit 10 in the second embodiment by using concrete values. Here, it is supposed that the output impedance Rmain of the first inverter M1 is 100 [Ω], the output impedance Rpost0 of the fifth inverter P11 is 800 [Ω], and the output impedance Rpost1 of the sixth inverter P12 is 400 [Ω].

FIG. 13 is a table showing the amplitude ratio V1/V2, when each of the output impedances takes the above value. As shown in FIG. 13, the output terminal 23 outputs the output data having the same waveform as that of the first test signal Dmain+, when the fifth inverter P11 and the sixth inverter P12 are in the off state. As shown in FIG. 13, the amplitude ratio V1/V2 is 0.78, when the fifth inverter P11 and the sixth inverter P12 are respectively set to the on state and the off state in response to the control signals outputted from the control circuit 16. Similarly, the amplitude ratio V1/V2 is 0.60 when the fifth inverter P11 and the sixth inverter P12 are in the off state and the on state, respectively. Also, the amplitude ratio V1/V2 is 0.45 when the fifth inverter P11 and the sixth inverter P12 are both in the on state.

Thus, the test signal generating circuit 10 in the second embodiment can control the amplitude ratio V1/V2 by changing the output impedance of the CMOS inverters of the test signal generating circuit 10. Therefore, the test signal generating circuit 10 in the second embodiment can output the output data (Dout+ and Dout−) in which the high-frequency component is removed and the jitter is added, by changing the amplitude ratio V1/V2.

In this way, a signal having a different amplitude can be added to a signal pattern of the test data. Thus, the operation test of the semiconductor device can be carried out by using a test signal having a signal waveform similar to an actual data signal which is supplied through a high speed data communication line, compared with a test in which a test data signal having a constant amplitude is supplied from the output path to the input path.

According to the present invention, it is possible to degrade a signal waveform of a test signal at any waveform degradation rate. Also, according to the present invention, it is possible to form a test circuit less subject to the effect of process variations at the time of manufacturing. Therefore, a test with higher reliability can be carried out.

What is claimed is:

1. A semiconductor device comprising:
an output path;
an input path; and
a test signal generating circuit configured to receive an output test data signal which is generated from a test data in said semiconductor device and transferred on said output path, to receive a delayed output test data signal delayed relative to the output test data signal, to generate an input test data signal by changing at least one of an amplitude and a phase of the output test data signal by combining said output test data signal and said delayed output test data signal, and to supply said input test data signal onto said input path,
wherein said output path and said input path are tested by using said output test data signal and said input test data signal, respectively.

2. The semiconductor device according to claim 1, further comprising:
a comparing circuit configured to compare said test data and a reception test data obtained from said input test data signal, and to determine whether or not said output path and said input path operate correctly, based on the comparing result.

3. A semiconductor device comprising:
an output path;
an input path; and
a test signal generating circuit configured to generate an input test data signal by changing at least one of an amplitude and a phase of an output test data signal which is generated from a test data in said semiconductor device and transferred on said output path, and to supply said input test data signal onto said input path,
wherein said output path and said input path are tested by using said output test data signal and said input test data signal, respectively,
wherein said test signal generating circuit comprises:
a first differential amplifier configured to receive said output test data signal as differential input signals and to output first differential output signals from output terminals; and
a second differential amplifier connected with said output terminals to have a same polarity of as said first differential amplifier, and
said second differential amplifier generates second differential output signals from delayed differential input signals obtained by delaying said differential input signals by 1 bit and supplies said second differential output signals to said output terminals.

4. The semiconductor device according to claim 3, wherein said first differential amplifier comprises:
a first differential transistor pair configured to receive said differential input signals; and
a first current source configured to supply a first current to said first differential transistor pair,
said second differential amplifier comprises:
a second differential transistor pair configured to receive said delayed differential input signals; and
a second current source configured to supply a second current to said second differential transistor pair, and
wherein a ratio of said first current to said second current is predetermined.

5. A semiconductor device comprising:
an output path;
an input path; and
a test signal generating circuit configured to generate an input test data signal by changing at least one of an amplitude and a phase of an output test data signal which is generated from a test data in said semiconductor device and transferred on said output path, and to supply said input test data signal onto said input path,
wherein said output path and said input path are tested by using said output test data signal and said input test data signal, respectively,
wherein said test signal generating circuit comprises:
a first buffer circuit configured to output a first output signal with a predetermined amplitude based on said output test data signal; and
a second buffer circuit configured to output a second output signal based on a delayed output test data obtained by delaying said output test data signal by one bit,
said first output signal and said second output signal are combined and outputted as said input test data signal which has an amplitude different from an amplitude of said output test data signal.

6. The semiconductor device according to claim 5, wherein said output test data signal comprises a first test signal and a second test signal which is an inversion signal of said first test signal,
said first buffer circuit comprises:
a first inverter configured to invert said first test signal to produce a first inversion test signal; and
a second inverter configured to invert said second test signal to produce a second inversion test signal, said second buffer circuit comprises:
a third inverter configured to invert a first delayed test signal obtained by delaying said first test signal to produce a first inversion delayed test signal; and
a fourth inverter configured to invert a second delayed test signal obtained by delaying said second test signal to produce a second inversion delayed test signal, and
said first inversion test signal and said first inversion delayed test signal are combined and output as a first input test signal,
said second inversion test signal and said second inversion delayed test signal are combined and output as a second input test signal, and
said input test data signal comprises said first input test signal and said second input test signal.

7. The semiconductor device according to claim 6, wherein said first and second inverters have output impedances different from those of said third and fourth inverters.

8. The semiconductor device according to claim 6, further comprising a control circuit configured to generate a control signal, and
wherein at least one of said third and fourth inverters comprises:
a CMOS inverter circuit; and
a switch configured to control an operation of said CMOS inverter in response to said control signal such that an output impedance of said at least one of said third and fourth inverters is controlled.

9. A test method of a semiconductor device, comprising:
generating an output test data signal from a test data in said semiconductor device and transferring said output test data signal on an output path;
delaying said output test data signal to produce a delayed output test data signal; and
generating an input test data signal from said output test data signal and said delayed output test data signal to change at least one of an amplitude and phase of said input test data signal and transferring onto an input path,
wherein said output path and said input path are tested by using said output test data signal and said input test data signal, respectively,
wherein said generating an input test data signal comprises:
combining said output test data signal and said delayed output test data signal in a predetermined ratio of an amplitude of said output test data signal and an amplitude of said delayed output test data signal.

10. The test method according to claim 9, further comprising:
comparing said test data and a reception test data obtained from said input test data signal, to determine whether or not said output path and said input path operate correctly, based on the comparing result.

11. The test method according to claim 9, wherein said generating an input test data signal comprises:
combining said output test data signal and said delayed output test data signal such that said input test data signal has a phase different from that of said output test data signal.

12. A test method of a semiconductor device, comprising:
generating an output test data signal from a test data in said semiconductor device and transferring said output test data signal on an output path;
delaying said output test data signal to produce a delayed output test data signal; and
generating an input test data signal from said output test data signal and said delayed output test data signal to change at least one of an amplitude and phase of said input test data signal and transferring onto an input path,
wherein said output path and said input path are tested by using said output test data signal and said input test data signal, respectively,
wherein said generating an input test data signal comprises:
combining said output test data signal and said delayed output test data signal such that said input test data signal has a phase different from that of said output test data signal.

13. The test method according to claim 12, further comprising:
comparing said test data and a reception test data obtained from said input test data signal, to determine whether or not said output path and said input path operate correctly, based on the comparing result.

14. A semiconductor device comprising:
an output path;
an input path; and
a test signal generating circuit configured to receive an output test data signal which is generated from a test data in said semiconductor device and transferred on said output path, to receive a delayed output test data signal delayed relative to the output test data signal, to generate an input test data signal by changing both an amplitude and a phase of the output test data signal by combining said output test data signal and said delayed output test data signal, and to supply said input test data signal onto said input path;
wherein said output path and said input path are tested by using said output test data signal and said input test data signal, respectively.

* * * * *